(12) United States Patent
Fan et al.

(10) Patent No.: US 9,653,866 B2
(45) Date of Patent: May 16, 2017

(54) REAL-TIME WAVELENGTH CORRECTION SYSTEM FOR VISIBLE LIGHT

(71) Applicant: 3DFAMILY TECHNOLOGY CO., LTD., New Taipei (TW)

(72) Inventors: Kuang-Chao Fan, Taipei (TW); Chih-Chin Hsu, Taipei (TW)

(73) Assignee: 3DFamily Technology Co., Ltd., New Taipei (TW)

( * ) Notice: Subject to any disclaimer, the term of this patent is extended or adjusted under 35 U.S.C. 154(b) by 44 days.

(21) Appl. No.: 14/793,158

(22) Filed: Jul. 7, 2015

(65) Prior Publication Data

US 2016/0261084 A1 Sep. 8, 2016

(30) Foreign Application Priority Data

Mar. 6, 2015 (TW) .............................. 104107292 A

(51) Int. Cl.
*G01B 9/02* (2006.01)
*H01S 3/00* (2006.01)
*G02B 27/42* (2006.01)
*G02B 27/00* (2006.01)
*H01S 5/0687* (2006.01)

(52) U.S. Cl.
CPC ........ *H01S 3/0014* (2013.01); *G02B 27/0056* (2013.01); *G02B 27/4244* (2013.01); *H01S 5/0687* (2013.01)

(58) Field of Classification Search
CPC ............................ H01S 5/0687; H01S 3/0014
USPC ......................................................... 356/493
See application file for complete search history.

(56) References Cited

U.S. PATENT DOCUMENTS 5,305,330 A * 4/1994 Rieder .................. H01S 5/0687
356/493

* cited by examiner

*Primary Examiner* — Thanh Luu
(74) *Attorney, Agent, or Firm* — Muncy, Geissler, Olds & Lowe, P.C.

(57) ABSTRACT

A real-time wavelength correction system for visible light is co-operated with an optical system to make a parallel light beam split into a zero-order diffractive parallel light beam and a first-order diffractive parallel light beam. The zero-order diffractive parallel light beam focuses on a first back focal plane to form a first light spot. A drift of the first light spot is applied to determine an angular drift of the parallel light beam. The first-order diffractive parallel light beam is focused on a second back focal plane to form a second light spot. A drift of the second light spot is applied to determine an angular drift of the first-order diffractive parallel light beam. The angular drifts of the parallel light beam and the first-order diffractive parallel light beam, which are changed with real time temperature variation, are applied to correct the wavelength of the parallel light beam.

10 Claims, 5 Drawing Sheets

REAL-TIME WAVELENGTH CORRECTION SYSTEM FOR VISIBLE LIGHT

FIELD OF THE INVENTION

The present invention relates to a real-time wavelength correction system for visible light, which is suitable for any optical system using wavelength as measurement or counting units. For example, the present invention can be applied to a laser displacement interferometer, which belongs to a technical field of precision measurement industry or precision machinery industry.

BACKGROUND OF THE INVENTION

Generally speaking, a Laser is a device that emits light through a process of optical amplification based on the stimulated emission of electromagnetic radiation. The working mechanism of Laser is that a standing wave and a luminous body co-operates to generate resonances in a resonant cavity, wherein light beams illuminate forward and backward within the cavity to stimulate electrons with high energy of the luminous body, so that a light beam with high energy density is formed and radiates out of the resonant cavity in a straight line. The light beam with high energy density, what is called Laser light beam, differs from other light sources because of Laser emits light coherently. Spatial coherence allows Laser to be focused to a tight spot, and also allows a Laser light beam to stay narrow over great or long distances, what is called collimation effect. Lasers can also have high temporal coherence, which allows them to emit light with a very narrow spectrum, i.e., they can emit a single color of light. Temporal coherence can be used to produce pulses of light as short as a femtosecond. As the above mentioned, Lasers have many special characters of high brightness, good monochromaticity, and good optical coherence, etc. In addition, Lasers can keep good illumination quality. Therefore, Lasers are currently widely applied to a variety of industries because of the above-mentioned characters. For example, Lasers are applied used in a laser displacement interferometer, which is an optical system using wavelength as the unit of measurement or counting, and is a kind of displacement measurement instrument. Displacement measurement instruments are commonly used in industries, such as precision measurement industry or precision machinery industry, for the calibration of positional accuracy, such as numerically controlled (NC) machine tools or linear motion positioning stages.

A laser consists of a gain medium, a mechanism to energize it, and something to provide optical feedback. The gain medium is a material with properties that allow it to amplify light by way of stimulated emission. Light of a specific wavelength that passes through the gain medium is amplified (increases in power). For the gain medium to amplify light, it needs to be supplied with energy in a process called pumping. The energy is typically supplied as an electrical current or as light at a different wavelength. Pump light may be provided by a flash lamp or by another laser. As the above mentioned, Lasers are very sensitive to environmental temperatures. When environmental temperature changes, the length of the resonant cavity of Laser varies accordingly. For example, the length of the resonant cavity of Laser is expanded or extended when the environmental temperatures are getting hotter or getting higher, or, on the contrary, the length of the resonant cavity of Laser is shrunk or shortened when the environmental temperatures are getting colder or getting lower. The wavelength of Laser is accordingly drifted or changed owing to the above-mentioned phenomenon that the length of the resonant cavity of Laser changes. Therefore, a variety of frequency stabilization techniques are developed for Lasers, which can reduce and stabilize the variations of wavelengths of Lasers and improve the stabilization of wavelengths of Lasers for resolving the problems mentioned above. However, prior frequency stabilization techniques have many shortcomings, such as complicated system, high cost, and low efficiency, etc. The problems of wavelength change or drift of Lasers are still serious and not resolved. It is known that the wavelength of laser in air is equal to its wavelength in vacuum divided by the refractive index of air. At any ambient condition, the actual wavelength of laser has to be corrected by the refractive index of air, which is a function of temperature, relative humidity and pressure. Common laser interferometers all require an air sensor that detect the current temperature, relative humidity and atmospheric pressure and correct the refractive index of air through a complicate formula, such as the Edlen equation, Ciddor equation or modified Edlen equation by Birch. These equations are all empirical equations for He—Ne Lasers and may not be suitable for Laser diode. Therefore, further techniques are necessarily demanded for adjusting and stabilizing the wavelength change or drift of Lasers efficiently.

Please referring to FIGS. 1 and 2, FIG. 1 shows a prior optical system of a real-time wavelength correction system for visible light, and FIG. 2 shows prior parallel light beam of first-order diffraction focusing on a light position sensing detector (PSD). As shown in FIGS. 1 and 2, a real-time wavelength correction system for visible light PA100 is collocated and operated with an optical system PA200. The optical system PA200 comprises a parallel light emitter PA201, a displacement interferometer module PA202 and a movable reflector PA203.

The parallel light emitter PA201 emits a parallel light beam (not marked in FIGS. 1 and 2) in a first direction L1. The displacement interferometer module PA202 is set on one side of the parallel light emitter PA201 along the first direction L1, so that the parallel light beam can pass through the displacement interferometer module PA202. The movable reflector PA203 is set on one side of the displacement interferometer module PA202 along the first direction L1 corresponding to the parallel light emitter PA201, so that the movable reflector PA203 can receive and reflect the parallel light beam passed from the displacement interferometer module PA202 along the first direction L1. Furthermore, the parallel light beam has a reference wavelength under a standard environmental state. For example, the standard environmental state is that the atmospheric pressure is at one atmospheric pressure (ATM) and the temperature is at 20 centigrade degrees. In one preferred embodiment, the optical system PA200 is preferred a laser displacement interferometer, the parallel light emitter PA201 is preferred a laser beam emitter, and the parallel light beam is accordingly preferred a Laser beam.

Generally speaking, the prior real-time wavelength correction system for visible light PA100 includes an optical beam splitter PA1, a diffractive grating PA2, a focusing lens PA3, a light spot position sensing detector PA4, and a supporting platform PA5.

The optical beam splitter PA1 is set between the parallel light emitter PA201 and the displacement interferometer module PA202 along the first direction L1 and the light path of parallel light beam. The parallel light beam can pass through the optical beam splitter PA1 and then pass through the displacement interferometer module PA202 along the first direction L1. The parallel light beam can be split into two beams, including a new split parallel light beam and the original parallel light beam, during passing through the optical beam splitter PA1 by split effect of the optical beam splitter PA1. The second direction L2 of the split parallel light beam is perpendicular to the first direction L1 of the original parallel light beam.

The diffractive grating PA2 is set on one side of the optical beam splitter PA1, for receiving the split parallel light beam split from the original parallel light beam, wherein the split parallel light beam is perpendicular to the original parallel light beam. Then, the split parallel light beam is diffracted by the diffractive grating PA2, and accordingly forms or generates a first-order diffractive parallel light beam PA2013 (shown in FIG. 2) in a diffraction direction L21 (shown in FIG. 1) by diffracting effect of the diffractive grating PA2. In one embodiment, the diffractive grating PA2 is preferred a transmission diffractive grating. The split parallel light beam can be diffracted into a variety of light beam in a variety of different radiation directions during passing through the diffractive grating PA2 from the second direction L2 under the standard environment state such as the atmospheric pressure at one atmospheric pressure (ATM) and the temperature at 20 centigrade degrees. In one embodiment, the first-order diffractive parallel light beam PA2013 (shown in FIG. 2) is preferred positive first-order diffractive parallel light beam.

According to the above mentioned, the diffraction angle of the positive first-order diffractive parallel light beam corresponding to the diffractive grating PA2 can be calculated according to the following prior diffraction equation:

$$d(\sin\theta_I + \sin\theta_q) = \lambda \quad (1)$$

Wherein d is the grating space, λ is the wavelength of the parallel light beam, $\theta_I$ is the incidence angle of the split parallel light beam in the second direction L2 and $\theta_q$ is the diffraction angle of the first-order diffractive parallel light beam PA2013 in a diffraction direction L21. When the incidence angle $\theta_I$ of the split parallel light beam is adjusted to zero, the positive first-order diffraction angle can be calculated according to the following equation:

$$\theta_q = \sin^{-1}\left(\frac{\lambda}{d}\right) \quad (2)$$

It is supposed that the wavelength of the reference first-order diffractive parallel light beam PA2013s and the split parallel light beam is a reference wavelength under a standard environment state (that is, the atmospheric pressure is at one atmospheric pressure (ATM) and the temperature is at 20 centigrade degrees), and the wavelength of the first-order diffractive parallel light beam PA2013 is an actual wavelength under a general environment state. Therefore, a difference of angle value Δθ1 between the reference first-order diffractive parallel light beam PA2013s and the first-order diffractive parallel light beam PA2013 can be easily calculated by comparing the reference wavelength with the actual wavelength. Furthermore, the diffraction angle value can be calculated by the operation computer of the optical system PA200 according to the autocollimator principle and the following equation:

$$\Delta x = f\tan(\Delta\theta 1) \quad (3)$$

Wherein, Δx is the difference between a light spot position parameter and a reference light spot position parameter, and f is the focal length of the focusing lens PA3.

Referring to FIG. 2, the focusing lens PA3 is used for receiving the first-order diffractive parallel light beam PA2013 diffracted from the diffractive grating PA2 and focusing the first-order diffractive parallel light beam PA2013 on a back focal plane of the focusing lens PA3 (not marked in FIG. 2). Consequently, the first-order diffractive parallel light beam PA2013 can focus on the back focal plane of the focusing lens PA3 to form a light spot AP1, wherein, the back focal plane is a plane formed by assembling all of the focus light spots which pass from the first-order diffractive parallel light beam PA2013 through the focusing lens PA3 and focus on the back focal plane of the focusing lens PA3.

The light spot position sensing detector PA4 is electrically connected to the operation computer of the optical system PA200, and the he light spot position sensing detector PA4 is set on the same place of the back focal plane of the focusing lens PA3. The light spot position sensing detector PA4 includes a sensing plane PA41, and the sensing plane PA41 overlaps the back focal plane of the focusing lens PA3. The sensing plane PA41 of the light spot position sensing detector PA4 is used for sending the forming place of the light spot AP1, so that the light spot position sensing detector PA4 can generate a light spot position parameter according to the forming place of the light spot AP1.

The focusing lens PA3 and the light spot position sensing detector PA4 are set on a supporting platform PA5. The supporting platform PA5 is provided for fixedly setting the focusing lens PA3 and the light spot position sensing detector PA4. Therefore, the light spot position sensing detector PA4 can be fixedly set and arranged on the supporting platform PA5 according to the focal length of the focusing lens PA3. In addition, the supporting platform PA5 is provided for adjusting the positions of the focusing lens PA3, the light spot position sensing detector PA4, and the diffractive grating PA2 simultaneously, and adjusting the distances between the focusing lens PA3, the light spot position sensing detector PA4, and the diffractive grating PA2 simultaneously.

As the above mentioned, the first-order diffractive parallel light beam PA2013 (shown in FIG. 2) is formed by the parallel light beam passing through the diffractive grating PA2 and then diffracted by the diffractive grating PA2, wherein a diffraction angle is generated between the first-order diffractive parallel light beam PA2013 and the normal line of the diffractive grating PA2 under a general environmental state. The first-order diffractive parallel light beam PA2013 passes through the focusing lens PA3, and then, the first-order diffractive parallel light beam PA2013 focuses on a back focal plane of the focusing lens PA3 (not marked in FIG. 2). Consequently, the first-order diffractive parallel light beam PA2013 can be focused by the focusing lens PA3 on the back focal plane of the focusing lens PA3 to form a light spot AP1. The light spot AP1 is used for calculating a light spot position parameter. On the other hand, a reference first-order diffractive parallel light beam PA2013s (shown in FIG. 2) is formed by the parallel light beam passing through the diffractive grating PA2 and then diffracted by the diffractive grating PA2 under a standard environment state. The reference first-order diffractive parallel light beam PA2013s passes through the focusing lens PA3, and then, the first-order diffractive parallel light beam PA2013 focuses on a back focal plane of the focusing lens PA3 (not marked in FIG. 2). That is, the reference first-order diffractive parallel light beam PA2013s can be focused by the focusing lens PA3 on the back focal plane of the focusing lens PA3 to form a light spot AP2, wherein so that the light spot position sensing detector PA4 can generate a reference light spot position parameter according to the forming place of the light spot AP2. The difference between the light spot position parameter and the reference light spot position parameter can be used to calculate a difference of angle value Δθ1 between the reference first-order diffractive parallel light beam PA2013s and the first-order diffractive parallel light beam PA2013 by comparing the reference wavelength with the actual wavelength. Accordingly, the reference wavelength can be corrected and a real-time correction actual wavelength is then generated according to the difference of angle value Δθ1.

As the above mentioned, the prior real-time wavelength correction system for visible light PA100 can correct the change of the wavelength of the parallel light beam due to the change of environment conditions by using optical diffraction principle. However, the temperatures of the parallel light emitter PA201 may rise because of the parallel light emitter PA201 emits the parallel light beam continuously for a long time. The changes of temperatures of the parallel light emitter PA201 will also result in the drift or change of the wavelength of the parallel light beam. Therefore, the performance of the prior real-time wavelength correction system will be weakened and downgraded. The incidence angle of the parallel light beam emitting from the parallel light emitter PA201 to the optical beam splitter PA1 will be changed or drifted, so that the incidence angle of the split parallel light beam split from the optical beam splitter PA1 to the diffractive grating PA2 will also be changed or drifted. The changed or drifted incidence angle of the split parallel light beam split from the optical beam splitter PA1 to the diffractive grating PA2 will result in the change or drift of the difference of angle value Δθ1. Therefore, the accuracy of a real-time wavelength correction value by using the prior real-time wavelength correction system, which performs a real-time wavelength correction by using the difference of angle value Δθ1, will be reduced.

BRIEF SUMMARY OF INVENTION

As the above mentioned, a common laser displacement interferometer usually uses a frequency stabilization technique, which can reduce and stabilize the changes and variations of wavelengths of Lasers and improve the stabilization of wavelengths of Lasers. However, the above mentioned frequency stabilization techniques have many shortcomings, such as complicated system, high cost, and low efficiency for frequency stabilization. In addition, a common wavelength-stabilized laser displacement interferometer still requires an additional air sensor that detect the current temperature, relative humidity and atmospheric pressure and correct the refractive index of air through a complicate formula for correcting the wavelength of Laser at a general environment state. Thus, it needs to develop further techniques for adjustment or stabilization the changes and variations of wavelengths of Lasers. Therefore, the prior real-time wavelength correction system is provided by using optical diffraction principle for correcting the changes of wavelengths of the Laser parallel light beam due to the change of environment conditions. However, as the above mentioned, the prior real-time wavelength correction system does not further consider the influence of the changing of temperatures of the parallel light emitter, which results in the drift or change of the wavelength of the parallel light beam. Therefore, the incidence angle of the parallel light beam will change or drift, so that the diffracted angle of the parallel light beam will also change or drift. The difference of diffracted angle of the parallel light beam calculated by prior diffraction correction technique will generate an error or inaccuracy. The performance of the prior real-time wavelength correction system will be weakened and downgraded.

As the shortcomings of prior art technique mentioned above, the present invention provides a real-time wavelength correction system for visible light to overcome the prior shortcomings mentioned above. For resolving the problems of prior art techniques that the wavelength of the parallel light beam will change or drift because of the change of temperature of the parallel light emitter as time goes by, the present invention uses a plurality of focusing lens and light spot position sensing detectors, and arranges or assembles these focusing lens and light spot position sensing detector specifically, to calculate the drifting angle of the parallel light beam or the difference of incidence angles of the parallel light beam correctly. The real-time wavelength correction system of the present invention can provide compensation and correction for the incidence angle of the parallel light beam according to the following optical equations. The optical equation of the present invention is modified from the above optical equation (1), wherein the θi of optical equations (1) is assumed to be a drifting angle Δθ of the parallel light beam. A present positive first-order diffraction angle is accordingly modified to the following optical equation (4):

$$\theta_q = \sin^{-1}\left[\left(\frac{\lambda}{d}\right) - \sin(\Delta\theta)\right] \qquad (4)$$

As the above mentioned, the present invention provides a real-time wavelength correction system for visible light, which includes many essential and important requirement listed as follows for resolving the problems caused by the prior art technique. The present real-time wavelength correction system for visible light is assembled to an optical system, and the real-time wavelength correction system for visible light co-works or co-operates with the optical system. The optical system emits a parallel light beam. The parallel light beam has an initial wavelength in an initial state. The present real-time wavelength correction system for visible light comprises an optical beam splitter, a first focusing lens, and a first light spot position sensing detector.

The optical beam splitter is used for splitting the parallel light beam. The parallel light beam is split into a split parallel light beam and the original parallel light beam after passing through the optical beam splitter. The first focusing lens is used for receiving the split parallel light beam, so that the split parallel light beam focuses on a first back focal plane of the first focusing lens and then form a first light spot. The first light spot position sensing detector is electrically connected to an operation computer of the optical system. The first light spot position sensing detector is set on the same place of the first back focal plane for sensing an initial position parameter and an initial real-time position parameter of the first light spot. A first real-time light spot displacement value is generated according to the initial position parameter and the initial real-time position parameter of the first light spot.

As the above mentioned, the initial wavelength can be real-time corrected by the first real-time light spot displacement value and the difference of angle value between the reference first-order diffractive parallel light beam and the first-order diffraction parallel light beam to generate a real-time wavelength correction value. Therefore, the present invention uses the first focusing lens and the first light spot position sensing detector sensing the initial position parameter and the initial real-time position parameter of the first light spot to generate the first real-time light spot displacement value. The present invention provides a real-time wavelength correction system, which can correct and adjust the change of the wavelength of the Laser parallel light beam caused by the change of environment conditions, and also correct and adjust the change of the wavelength of the Laser parallel light beam caused by the rising of temperature of the parallel light emitter as time goes by. Therefore, the performance of the optical system can be improved and the accuracy of measurement of the optical system can be increased.

As the essential requirements of the present invention mentioned above, one of the subsidiary derivations of techniques of the present invention is that the present real-time wavelength correction system for visible light further comprises a diffractive grating, a second focusing lens, and a second light spot position sensing detector. The diffractive grating is used for receiving the split parallel light beam which is split from the parallel light beam passing through the optical beam splitter. The split parallel light beam generates both a zeroth-order diffractive parallel light beam and a first-order diffractive parallel light beam after passing the diffractive grating. Then, the first focusing lens is used for receiving the zeroth-order diffractive parallel light beam and the second focusing lens is used for receiving the first-order diffractive parallel light beam. The zeroth-order diffractive parallel light beam then focuses on the first back focal plane to form a first light spot. A diffraction angle is formed between the first-order diffractive parallel light beam and a normal line of the diffractive grating. The second focusing lens is used for receiving the first-order diffractive parallel light beam, so that the first-order diffractive parallel light beam can focus on the second back focal plane to form a second light spot. The second light spot position sensing detector is electrically connected to the operation computer of the optical system for sensing a position parameter of the second light spot. The second light spot position sensing detector is set on the same place of the second back focal plane for sensing the position parameter of the second light spot, and then generates a second light spot position parameter corresponding to the diffraction angle according to the position parameter of the second light spot mentioned above.

Furthermore, the split parallel light beam can generate a reference first-order diffractive parallel light beam under a standard state after passing through the diffractive grating and diffracted by the diffractive grating. The reference first-order diffractive parallel light beam then focuses on the second back focal plane of the second focusing lens to form a reference light spot after passing through the second focusing lens. The reference light spot is used for setting a reference light spot position parameter. The difference of the reference light spot position parameter and the second light spot position parameter is used for calculating a difference of angle value between the reference first-order diffractive parallel light beam and the present first-order diffractive parallel light beam. A real-time wavelength correction value is generated by correcting or adjusting the initial wavelength value according to the second real-time light spot displacement value and the difference of angle value between the reference first-order diffractive parallel light beam and the present first-order diffractive parallel light beam.

In one preferred embodiment, the first-order diffractive parallel light beam can be a positive first-order diffractive parallel light beam or a negative first-order diffractive parallel light beam. In addition, the diffractive grating can be selected from a transmission type diffractive grating or a reflection type diffractive grating, in which the transmission type diffractive grating is the preferred one.

As the essential requirements of the present invention mentioned above, one of the subsidiary derivations of techniques the present invention is that the parallel light beam is preferred a Laser beam.

As the essential requirements of the present invention mentioned above, one of the subsidiary derivations of techniques the present invention is that the optical system is preferred a Laser displacement interferometer.

As the essential requirements of the present invention mentioned above, one of the subsidiary derivations of techniques the present invention is that the first light spot position sensing detector has a first sensing plane, the first sensing plane overlaps the first back focal plane of the first focusing lens.

As the essential requirements of the present invention mentioned above, one of the subsidiary derivations of techniques the present invention is that the first focusing lens and the first light spot position sensing detector are fixedly set on a supporting platform.

As the above mentioned, the present real-time wavelength correction system for visible light can measure and calculate the first real-time light spot displacement value by using the first focusing lens and the first light spot position sensing detector for sensing the split parallel light beam. Then, a real-time wavelength correction value is generated according to the first real-time light spot displacement value. The present invention provides real-time correction and adjustment for the change of the wavelength of the Laser parallel light beam caused by the changes of environment conditions, and for the change of the wavelength of the Laser parallel light beam caused by the rising of temperature of the parallel light emitter as time goes by. Therefore, the performance of the optical system can be improved and the accuracy of measurement of the optical system can be increased.

The objectives, technical details, features, and effects of the present invention will be better understood with regard to the detailed description of the embodiments below, with reference to the drawings.

DETAILED DESCRIPTION OF THE INVENTION

Figure 1:
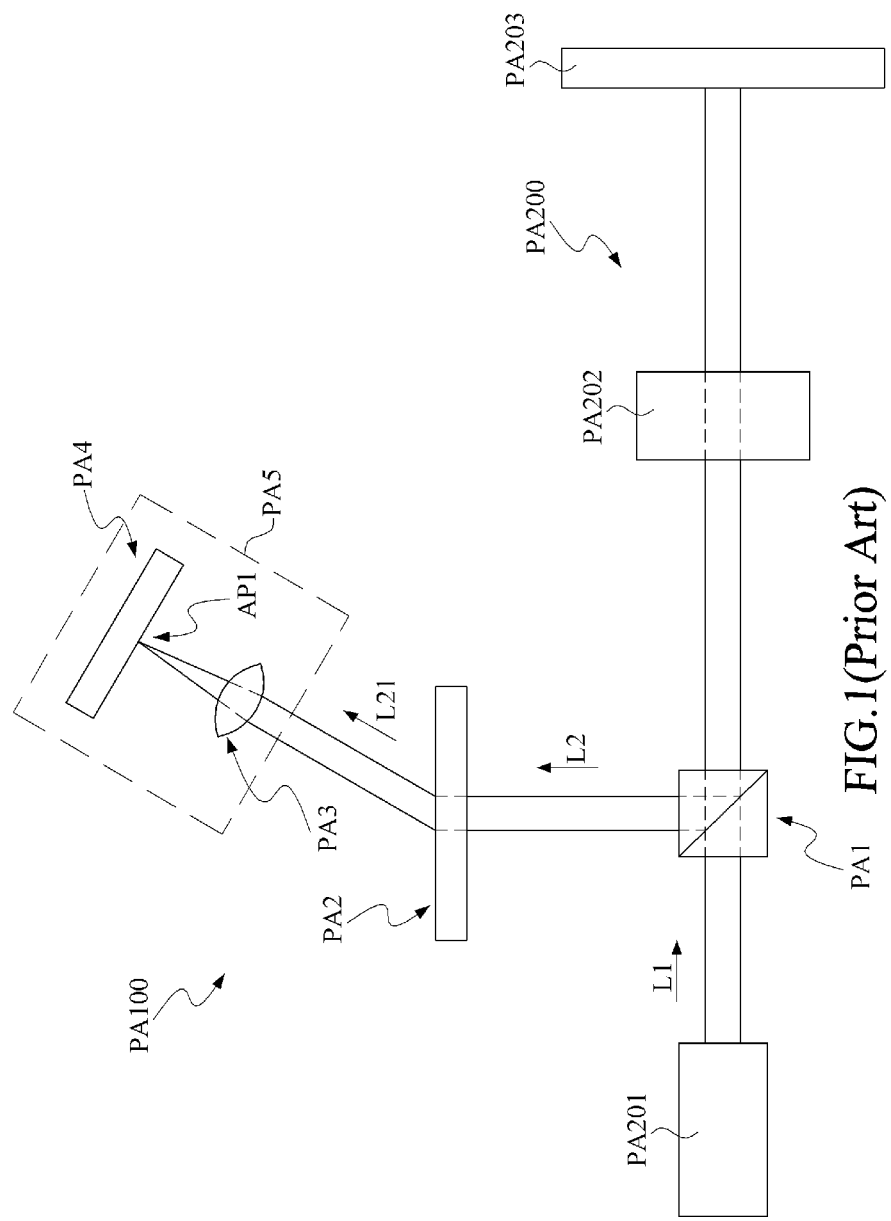
FIG. 1 shows a prior optical system of a real-time wavelength correction system for visible light.
Figure 2:
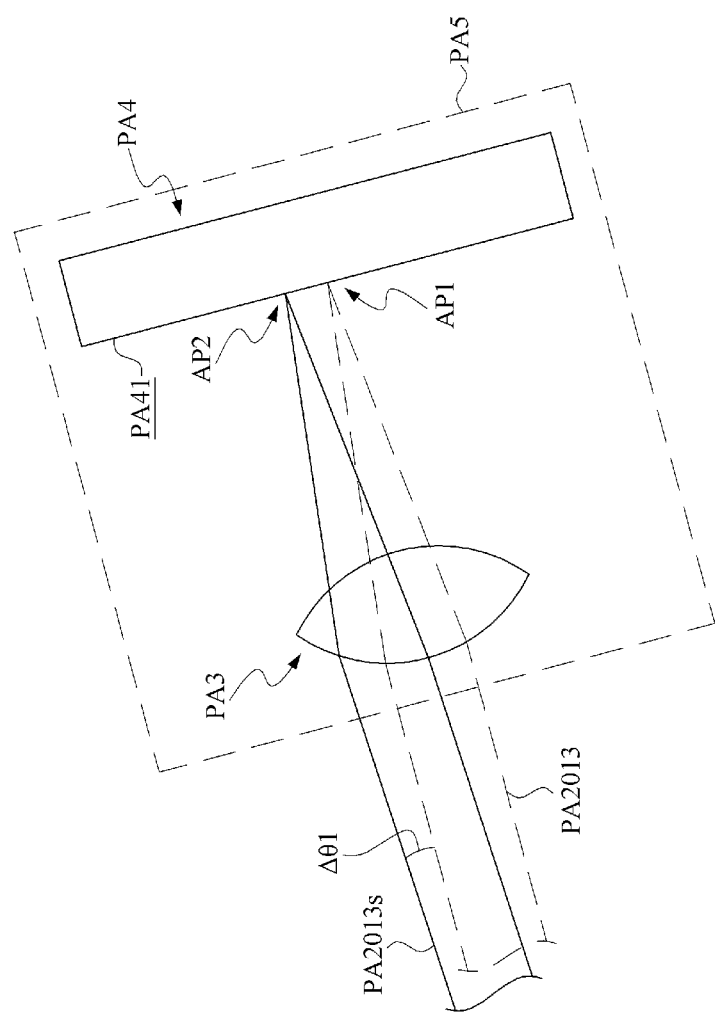
FIG. 2 shows prior parallel light beam of first-order diffraction focusing on a light position sensing detector (PSD).
Figure 3:
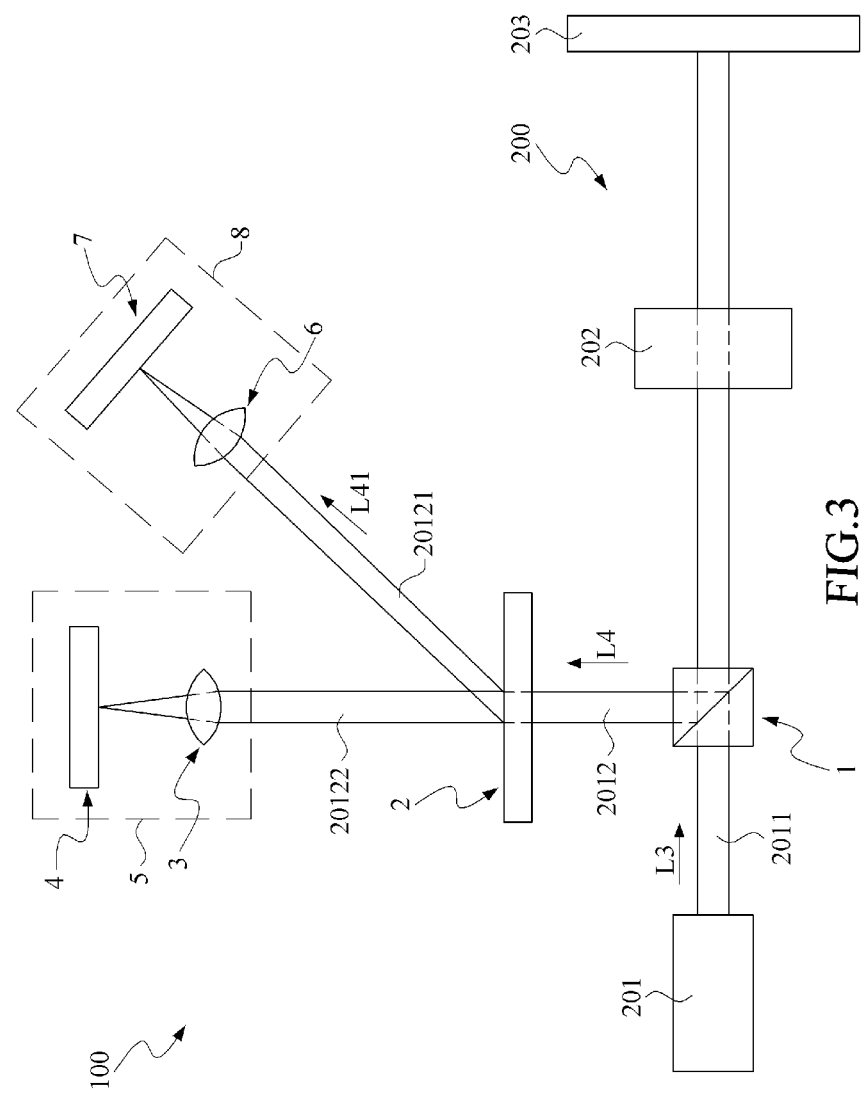
FIG. 3 shows a top view of an embodiment of a real-time wavelength correction system for visible light collocated and operated with an optical system according to the present invention.
Figure 4:
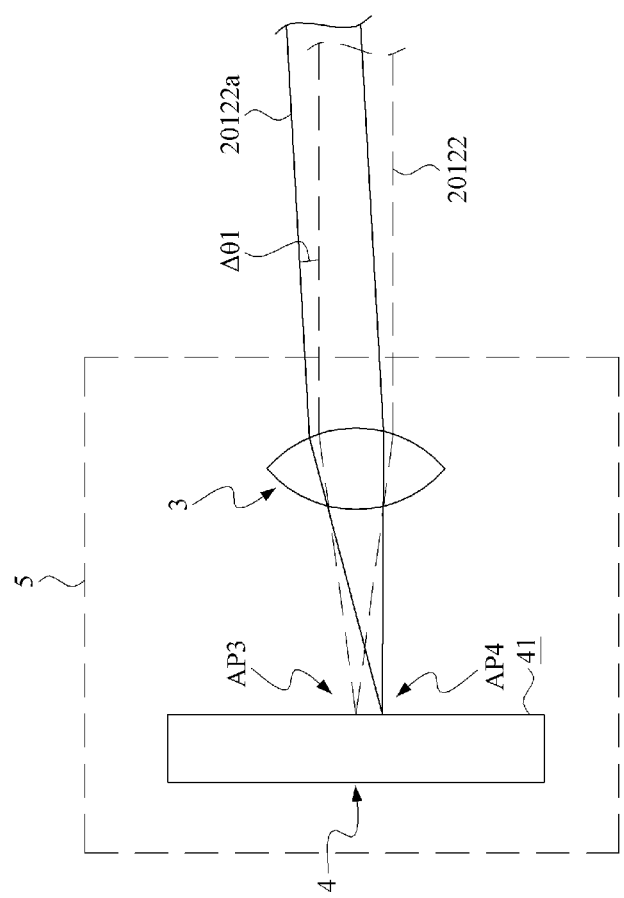
FIG. 4 shows a top view of an embodiment of a first split parallel light beam focusing on a first light position sensing detector (PSD) according to the present invention.
Figure 5:
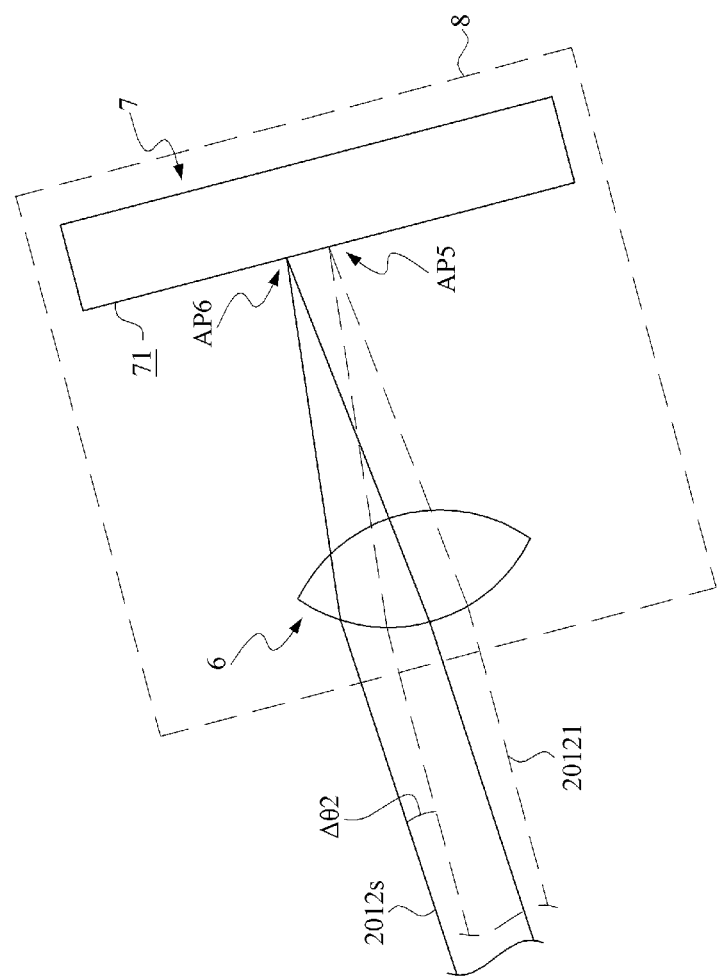
FIG. 5 shows a top view of an embodiment of parallel light beam of first-order diffraction focusing on a second light position sensing detector (PSD) according to the present invention.

Please refer to FIGS. 3, 4 and 5, wherein FIG. 3 shows a top view of an embodiment of a real-time wavelength correction system for visible light 100 collocated and operated with an optical system 200 according to the present invention, FIG. 4 shows a top view of an embodiment of a first split parallel light beam focusing a zeroth-order diffractive beam on a first light position sensing detector (PSD) 4 according to the present invention, and FIG. 5 shows a top view of an embodiment of parallel light beam of first-order diffraction focusing on a second light position sensing detector (PSD) 7 according to the present invention. As shown in FIG. 3, a real-time wavelength correction system for visible light 100 is assembled to and operated with the optical system 200. The optical system 200 comprises a parallel light emitter 201, a displacement interferometer module 202 and a movable reflector 203.

The parallel light emitter 201 emits a parallel light beam 2011 in a first direction L3. The displacement interferometer module 202 is set on one side of the parallel light emitter 201 along the first direction L3, so that the parallel light beam 2011 can pass through the displacement interferometer module 202. The movable reflector 203 is set on one side of the displacement interferometer module 202 along the first direction L3 corresponding to the parallel light emitter 201, so that the movable reflector 203 can receive and reflect the parallel light beam 2011 passed from the displacement interferometer module 202 along the first direction L3. Furthermore, when the parallel light emitter 201 starts to operate, there is an initial temperature in an initial environmental state, and the parallel light beam 2011 has an initial wavelength corresponding to the initial temperature in the initial environmental state. In a preferred embodiment of the present invention, the optical system 200 is preferred a Laser displacement interferometer, a parallel light emitter 201 is preferred a Laser environmental, and the parallel light beam 2011 is preferred a Laser beam. For example, the initial environment state is that the atmospheric pressure is at one atmospheric pressure (ATM) and the temperature is at 20 centigrade degrees.

The real-time wavelength correction system for visible light 100 comprises an optical beam splitter 1, a diffractive grating 2, a first focusing lens 3 and a first light spot position sensing detector (PSD) 4, a supporting platform 5, a second focusing lens 6, a second light spot position sensing detector 7 and a supporting platform 8.

The optical beam splitter 1 is used for splitting the parallel light beam 2011 when the parallel light beam 2011 passing through the optical beam splitter 1. Then, the optical beam splitter 1 generates a split parallel light beam 2012 after the parallel light beam 2011 passing through the optical beam splitter 1. The split parallel light beam 2012 travels in a second direction L4 after the parallel light beam 2011 passing through the optical beam splitter 1, wherein the second direction L4 of the split parallel light beam 2012 is perpendicular to the first direction L3 of the original parallel light beam 2011.

The diffractive grating 2 is used for receiving the split parallel light beam 2012, and diffracting the split parallel light beam 2012. The split parallel light beam 2012 is diffracted into a zeroth-order diffractive parallel light beam 20122 and a first-order diffractive parallel light beam 20121 by the diffraction effect of the diffractive grating 2 when the split parallel light beam 2012 passing through the diffractive grating 2. The zeroth-order diffractive parallel light beam 20122 travels in the original second direction L4, while the first-order diffractive parallel light beam 20121 travels in another diffraction direction L41.

As the above mentioned, a diffraction angle is formed between the first-order diffractive parallel light beam 20121 and the normal line of the diffractive grating 2, wherein the first-order diffractive parallel light beam 20121 can be a positive first-order diffractive parallel light beam or a negative first-order diffractive parallel light beam. In addition, in a preferred embodiment of the present invention, the diffractive grating 2 is preferred a transmission type diffractive grating. The present invention, of course, does not limit to the transmission type diffractive grating, but also includes the application of reflection type diffractive grating. The diffractive grating 2 can further be a reflection diffractive grating. No matter the reflection diffractive grating or the transmission diffractive grating, they all can perform the diffraction effect on the incidence light beam. The working mechanisms of the two kinds of diffractive gratings are described very much the same as in prior art technical field and known by everyone who skills in the art, thus it is not necessary to describe any more here.

In addition, in other preferred embodiment of the present invention, one can modify or adjust the grating period of the diffraction grating, the focal length of the focusing lens, or the position of the light spot position sensing detector, according to the wavelength of the parallel light beam, for applying the present invention to other optical system other than the laser displacement interferometer. In other words, the optical system applied in the present invention is not only limited to the laser displacement interferometer mentioned above, but also includes a non-laser displacement interferometer. The first focusing lens 3 is used for receiving the split parallel light beam 2012. Or specifically speaking, the first focusing lens 3 is used for receiving the zeroth-order diffractive parallel light beam 20122, and lets the zeroth-order diffractive parallel light beam 20122 focus on a first back focal plane of the first focusing lens 3 to form a first light spot AP3 after the split parallel light beam 2012 or the zeroth-order diffractive parallel light beam 20122 passing through the first focusing lens 3.

Please referring to FIGS. 3 and 4, the first light spot position sensing detector 4 is electrically connected to an operation computer of the optical system 200. The first light spot position sensing detector 4 is set on the same place of the first back focal plane (not marked in FIG. 4). A first sensing plane 41 is formed overlapping the first back focal plane of the first focusing lens 3. When the parallel light emitter 201 starts to operate, there is an initial temperature in an initial environmental state, and the parallel light beam 2011 has an initial wavelength corresponding to the initial environmental state. And, the first light spot position sensing detector 4 is used for sensing and measuring the first light spot AP3 of the zeroth-order diffractive parallel light beam 20122 when the zeroth-order diffractive parallel light beam 20122 focusing on the first sensing plane 41. Then, an initial position parameter of the first light spot AP3 is generated by the operation computer of the optical system 200 corresponding to the initial temperature of the parallel light emitter 201. As the parallel light emitter 201 emits the parallel light beam 2011 consistently and continuously, the parallel light beam 2011 and the split parallel light beam 2012 will gradually form a drifted zeroth-order diffractive parallel light beam 20122a as emitting time of the parallel light emitter 201 goes by. There is a real-time light spot AP4 formed by the drifted zero-order diffractive parallel light beam 20122a focusing on the first sensing plane 41, and a drifted difference of angle value $\Delta\theta 1$ formed between the initial/reference zero-order diffractive parallel light beam 20122 and the drifted zero-order diffractive parallel light beam 20122a. Hence, the real-time light spot AP4 corresponding to the real-time temperature is generated by the first light spot AP3 corresponding to the initial temperature moving from an original position of the first light spot AP3 to a real-time position of the real-time light spot AP4 as emitting time of the parallel light emitter 201 goes by. A real-time light spot position parameter is generated by the operation computer of the optical system 200 when the first light spot position sensing detector 4 senses the real-time light spot AP4. Therefore, a first real-time light spot displacement value is generated according to a difference between the real-time light spot position parameter and the initial position parameter, and the difference of angle value $\Delta\theta 1$ can be calculated by present optical equation (3), so that a drift of the parallel light beam 2011 resulting from the operating temperature rising of the parallel light emitter 201 can be calculated.

As shown in FIG. 4, the supporting platform 5 is provided for fixedly setting the first focusing lens 3 and the first light spot position sensing detector 4. In addition, the first light spot position sensing detector 4 is fixedly set on the supporting platform 5 corresponding to the focal length of the first focusing lens 3, so that a user can arrange and adjust the positions of the first focusing lens 3, the first light spot position sensing detector, and the optical beam splitter 1, and the user can arrange and adjust the distances between the first focusing lens 3, the first light spot position sensing detector, and the optical beam splitter 1 simultaneously.

Referring to FIGS. 3 and 5, the second focusing lens 6 is used for receiving a first-order diffractive parallel light beam 20121. The first-order diffractive parallel light beam 20121 focuses on a second back focal plane of the second focusing lens 6 to form a second light spot AP5 after passing through the second focusing lens 6.

The second light spot position sensing detector 7 is electrically connected to the operation computer of an optical system 200, and the second light spot position sensing detector 7 has a second sensing plane 71. The second sensing plane 71 is formed overlapping the second back focal plane of the second focusing lens 6. The second light spot position sensing detector 7 is used for sensing and measuring the second light spot AP5 of the first-order diffractive parallel light beam 20121 when the first-order diffractive parallel light beam 20121 focusing on the second sensing plane 71. Then, a second light spot position parameter of the second light spot AP5 is generated by the operation computer of the optical system 200 corresponding to the diffraction angle. The supporting platform 8 is provided for fixedly setting the second focusing lens 6 and the second light spot position sensing detector 7, as shown in FIG. 5. In addition, the second light spot position sensing detector 7 is fixedly set on the supporting platform 8 corresponding to the focal length of the second focusing lens 6, so that a user can arrange and adjust the positions of the second focusing lens 6, the second light spot position sensing detector 7, and the diffractive grating 2, and the user can arrange and adjust the distances between the second focusing lens 6, the second light spot position sensing detector 7, and the diffractive grating 2 simultaneously.

As shown in FIG. 5, a reference first-order diffractive parallel light beam 2012s is generated after the second split parallel light beam 2012 diffracted by the diffractive grating 2 under a standard state. The reference first-order diffractive parallel light beam 2012s passes through the second focusing lens 6 and focuses on the second back focal plane of the second focusing lens 6 to form a reference light spot AP6. The reference light spot AP6 is used for setting a reference light spot position parameter. Then, a difference of angle value $\Delta\theta 2$ between the reference first-order diffractive parallel light beam 2012s and the drifted first-order diffractive parallel light beam 20121 can be calculated according to the difference of the reference light spot position parameter and the second light spot position parameter.

In one preferred embodiment of the present invention, the diffractive grating 2, the second focusing lens 6, and the second light spot position sensing detector 7 are collocated and co-operated, so that difference of angle value $\Delta\theta 2$ between the reference first-order diffractive parallel light beam 2012s and the drifted first-order diffractive parallel light beam 20121 can be calculated for further correcting and compensating the variations of wavelengths of the parallel light beam 2011.

As the above mentioned, the first focusing lens 3 and the first light spot position sensing detector 4 are collocated and co-operated, so that a first real-time light spot displacement value for the zeroth-order diffractive parallel light beam 20122 can be calculated. The zeroth-order diffractive parallel light beam 20122 can be viewed as a drifted displacement value of the parallel light beam 2011 caused by the parallel light emitter 201 emitting the parallel light beam 2011 consistently and continuously for a long time. Furthermore, the diffractive grating 2, the second focusing lens 6, and the second light spot position sensing detector 7 are collocated and co-operated, so that difference of angle value $\Delta\theta 2$ between the reference first-order diffractive parallel light beam 2012s and the drifted first-order diffractive parallel light beam 20121 can be calculated. The difference of angle value $\Delta\theta 2$ caused by the drifted wavelengths of the first-order diffractive parallel light beam 20121 diffracted by the diffractive grating 2 because of the real time temperature variation. As the above mentioned, the preferred embodiment of the present invention can correct and compensate the variations of wavelengths of the parallel light beam 2011 because of the influence of temperature and time.

In other words, the preferred embodiment of the present invention not only can correct and compensate the variation of the wavelength of the parallel light beam 2011 because of the influence of the drift of parallel light beam 2011 due to the temperature rising of the parallel light emitter 201 as time goes by, but also can correct the projecting angle between the first-order diffractive parallel light beam 20121 and the diffractive grating 2 by using the first real-time light spot displacement value, so that the variations of wavelengths of the parallel light beam 2011 can be corrected and compensated by the first real-time light spot displacement value. Therefore, comparing with prior art technique, the present real-time wavelength correction system for visible light can achieve the object of wavelength compensation and correction accurately with more simple system and lower cost.

The detail description of the aforementioned preferred embodiments is for clarifying the feature and the spirit of the present invention. The present invention should not be limited by any of the exemplary embodiments described herein, but should be defined only in accordance with the following claims and their equivalents. Specifically, those skilled in the art should appreciate that they can readily use the disclosed conception and specific embodiments as a basis for designing or modifying other structures for carrying out the same purposes of the present invention without departing from the scope of the invention as defined by the appended claims.

We claim:

1. A real-time wavelength correction system for visible light, assembled to and co-operating with an optical system, the optical system emitting a parallel light beam, the parallel light beam having an initial wavelength value in an initial state, the real-time wavelength correction system for visible light comprising:

an optical beam splitter configured for the parallel light beam passing through to generate a split parallel light beam;

a diffractive grating configured to receive the split parallel light beam, the split parallel light beam passing through the diffractive grating and forming a zeroth-order diffractive parallel light beam and a first-order diffractive parallel light beam;

a first focusing lens configured to receive the zeroth-order diffractive parallel light beam to make the zeroth-order diffractive parallel light beam focused on the first back focal plane to form the first light spot, and further to make a diffraction angle be formed between the first-order diffractive parallel light beam and a normal line of the diffractive grating;

a second focusing lens configured to receive the first-order diffractive parallel light beam, and to make the first-order diffractive parallel light beam focused on a second back focal plane of the second focusing lens to form a second light spot after the split parallel light beam diffracted into the first-order diffractive parallel light beam;

a first light spot position sensing detector electrically connected to an operating computer of the optical system, and set on the first back focal plane for sensing an initial position parameter and an initial real-time position parameter of the first light spot to accordingly generate a first real-time light spot displacement value; and a second light spot position sensing detector electrically connected to the operating computer of the optical system, and set on the second back focal plane for sensing a position parameter of the second light spot to accordingly generate a second light spot position parameter corresponding to the diffraction angle;

wherein the split parallel light beam generates a reference first-order diffractive parallel light beam after passing through and diffracted by the diffractive grating under a standard state, the reference first-order diffractive parallel light beam is focused by the second focusing lens to form a reference spot on the second back focal plane, the reference light spot is applied to set a reference light spot position parameter, a deviation value between the reference light spot position parameter and the second light spot position parameter is applied to calculate an angular change value between the reference first-order diffractive parallel light beam and the first-order diffractive parallel light beam, the initial wavelength value is corrected by the first real-time light spot displacement value and the angular change value to generate the real-time wavelength correction value under the current environmental state.

2. The real-time wavelength correction system for visible light of claim 1, wherein the first-order diffractive parallel light beam is a positive first-order diffractive parallel light beam.

3. The real-time wavelength correction system for visible light of claim 1, wherein the first-order diffractive parallel light beam is a negative first-order diffractive parallel light beam.

4. The real-time wavelength correction system for visible light of claim 1, wherein the diffractive grating is a transmission type diffractive grating.

5. The real-time wavelength correction system for visible light of claim 1, wherein the diffractive grating is a reflection type diffractive grating.

6. The real-time wavelength correction system for visible light of claim 1, wherein the parallel light beam is a laser beam.

7. The real-time wavelength correction system for visible light of claim 1, wherein the optical system is a laser displacement interferometer.

8. The real-time wavelength correction system for visible light of claim 1, wherein the optical system is a non-laser displacement interferometer.

9. The real-time wavelength correction system for visible light of claim 1, wherein the first light spot position sensing detector has a first sensing plane overlapping the first back focal planes.

10. The real-time wavelength correction system for visible light of claim 1, wherein the first focusing lens and the first light spot position sensing detector is fixedly set on a supporting platform.

\* \* \* \* \*